United States Patent
Peterson et al.

(10) Patent No.: US 6,818,137 B2
(45) Date of Patent: Nov. 16, 2004

(54) FABRICATION OF ELECTRONIC MAGNETIC, OPTICAL, CHEMICAL, AND MECHANICAL SYSTEMS USING CHEMICAL ENDPOINT DETECTION

(75) Inventors: Jeffrey J. Peterson, Folsom, CA (US); Charles E. Hunt, Davis, CA (US)

(73) Assignee: The Regents of the University of California, Oakland, CA (US)

( * ) Notice: Subject to any disclaimer, the term of this patent is extended or adjusted under 35 U.S.C. 154(b) by 253 days.

(21) Appl. No.: 10/146,279

(22) Filed: May 15, 2002

(65) Prior Publication Data

US 2003/0213769 A1 Nov. 20, 2003

(51) Int. Cl.[7] .............................. C23F 1/00; B44C 1/22; C25F 3/00
(52) U.S. Cl. ............................................. 216/2; 216/11
(58) Field of Search ................................. 216/2, 11, 79, 216/99, 20, 33, 24; 438/719, 753, 689; 385/52, 88, 53, 62, 65, 81, 83, 98; 285/24, 26; 411/451.1, 487, 493; 29/464

(56) References Cited

U.S. PATENT DOCUMENTS

| | | | |
|---|---|---|---|
| 5,312,456 A | 5/1994 | Reed et al. ................ | 411/456 |
| 5,849,204 A * | 12/1998 | Matsumoto .................. | 216/11 |
| 6,393,685 B1 | 5/2002 | Collins ......................... | 29/416 |
| 6,547,973 B2 | 4/2003 | Field .............................. | 216/2 |
| 6,599,436 B1 * | 7/2003 | Matzke et al. ................ | 216/24 |

* cited by examiner

Primary Examiner—Gregory Mills
Assistant Examiner—Roberts Culbert
(74) Attorney, Agent, or Firm—Park, Vaughan & Fleming, LLP

(57) ABSTRACT

One embodiment of the present invention provides a system that facilitates construction of electromagnetic, optical, chemical, and mechanical systems using chemical endpoint detection. The system operates by receiving a system description that specifies multiple components, including a first component and a second component. The system fabricates the first component and the second component using selected construction materials. The system also creates a first interconnection structure on the first component and a second interconnection structure on the second component. These interconnection structures can be created using a sacrificial layer and chemical endpoint detection. Next, the system brings the first component and the second component together by connecting the first interconnection structure and the second interconnection structure. These interconnection structures align the first component to the second component so that accurate alignment can be achieved.

20 Claims, 5 Drawing Sheets

FABRICATION OF ELECTRONIC MAGNETIC, OPTICAL, CHEMICAL, AND MECHANICAL SYSTEMS USING CHEMICAL ENDPOINT DETECTION

RELATED APPLICATION

The subject matter of this application is related to the subject matter in co-pending non-provisional applications by the same inventors as the instant application entitled, "Method and Apparatus for Fabricating Structures Using Chemically-Selective Endpoint Detection," having Ser. No. 09/900,300, and filing date Jul. 5, 2001, now U.S. Pat. No. 6,642,154; "Fabricating Structures Using Chemo-Mechanical Polishing and Chemically-Selective Endpoint Detection," having Ser. No. 09/900,299, and filing date Jul. 5, 2001, now U.S. Pat. No. 6,465,357; "Method of Fabricating Three-Dimensional Components Using Endpoint Detection," having Ser. No. 10/061,501, and filing date Jan. 31, 2002, now U.S. Pat. No. 6,559,058; and "Fabrication of Optical Components Using Si, SiGe, SiGeC, and Chemical Endpoint Detection," having Ser. No. 10/146,278, and filing date May 15, 2002 (Attorney Docket No. UC02-059-1).

GOVERNMENT LICENSE RIGHTS

This invention was made with United States Government support under Grant Numbers N00014-93-C-0114 and N00014-96-C-0219, awarded by the Office of Naval Research. The United States Government has certain rights in the invention.

BACKGROUND

1. Field of the Invention

The present invention relates to microcircuit fabrication. More specifically, the present invention relates to a method and an apparatus to facilitate fabrication of electromagnetic, optical, chemical, and mechanical systems using chemical endpoint detection.

2. Related Art

The dramatic advances in computer system performance during the past 20 years can largely be attributed to improvements in the processes that are used to fabricate integrated circuits. By making use of the latest fabrication processes, integrated circuit designers can presently integrate computing systems comprised of hundreds of millions of transistors onto a single semiconductor die which is a fraction of the size of a human fingernail.

Recent advances in construction techniques allow types of circuit elements other than transistors to be fabricated on semiconductor wafers. These other types of circuit elements include, but are not limited to, optical components, fiber optic channels, fluid channels, piezoelectric devices, peltier devices, electromechanical components, quantum effect devices, and combinations of these components. These circuit elements can also be combined into three-dimensional structures.

A typical fabrication process builds structures through successive cycles of layer deposition and subtractive processing, such as etching. As the dimensions of individual circuit elements continue to decrease, it is becoming necessary to more tightly control the etching operation. For example, in a typical etching process, etching is performed for an amount of time that is estimated by taking into account the time to etch through a layer to reach an underlying layer, and the time to over-etch into the underlying layer. However, this process can only be controlled to +/−100 Angstroms, which can be a problem when fine control of dimensions is required.

Additionally, these smaller dimensions create alignment problems when coupling these devices together or when attaching external components such as wires and optical fibers. Systems that bring together multiple semiconductor die require accurate alignment to allow coupling of optical signals, electrical signals, mechanical devices, and fluid pipes from one semiconductor die to another semiconductor die.

What is needed is a method and an apparatus to facilitate fabrication of electromagnetic, optical, chemical, and mechanical systems and interconnection structures that do not display the problems described above.

SUMMARY

One embodiment of the present invention provides a system that facilitates construction of electromagnetic, optical, chemical, and mechanical systems using chemical endpoint detection. The system operates by receiving a system description that specifies multiple components, including a first component and a second component. The system fabricates the first component and the second component using selected construction materials. The system also creates a first interconnection structure on the first component and a second interconnection structure on the second component. These interconnection structures can be created using a sacrificial layer and chemical endpoint detection. Next, the system brings the first component and the second component together by connecting the first interconnection structure and the second interconnection structure. These interconnection structures align the first component to the second component so that accurate alignment can be achieved.

In one embodiment of the present invention, the selected construction material includes Si, SiGe, or SiGeC.

In one embodiment of the present invention, chemical endpoint detection involves selectively etching the selected construction material.

In one embodiment of the present invention, tetramethylammonium hydroxide (TMAH) or potassium hydroxide (KOH-$H_2O$) is used to selectively etch Si.

In one embodiment of the present invention, hydrofluoric/nitric/acetic (HNA) acids are used to selectively etch SiGe, and SiGeC.

In one embodiment of the present invention, the first component includes one of an electromagnetic component, an optical component, a chemical component, a mechanical component, or other components.

In one embodiment of the present invention, the second component includes one of an electromagnetic component, an optical component, a chemical component, a mechanical component, or other components.

In one embodiment of the present invention, the system fabricates locking structures on the first interconnection structure and the second interconnection structure, so that the first component and the second component are locked together when the first interconnection structure is connected to the second interconnection structure.

In one embodiment of the present invention, the system fabricates gaskets on the first interconnection structure and the second interconnection structure, so that the interface between the first component and the second component are sealed to prevent leakage when the first interconnection structure is inserted into the second interconnection structure.

In one embodiment of the present invention, the system creates a third interconnection structure, wherein the third interconnection structure can accept either an individual optical fiber, an individual wire, a fluidic channel, or other connectors.

In one embodiment of the present invention, the first component and the second component are constructed on a single substrate.

In one embodiment of the present invention, the first component is constructed on a first substrate and the second component is constructed on a second substrate.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

On-Chip Optical Fiber

Figure 1:
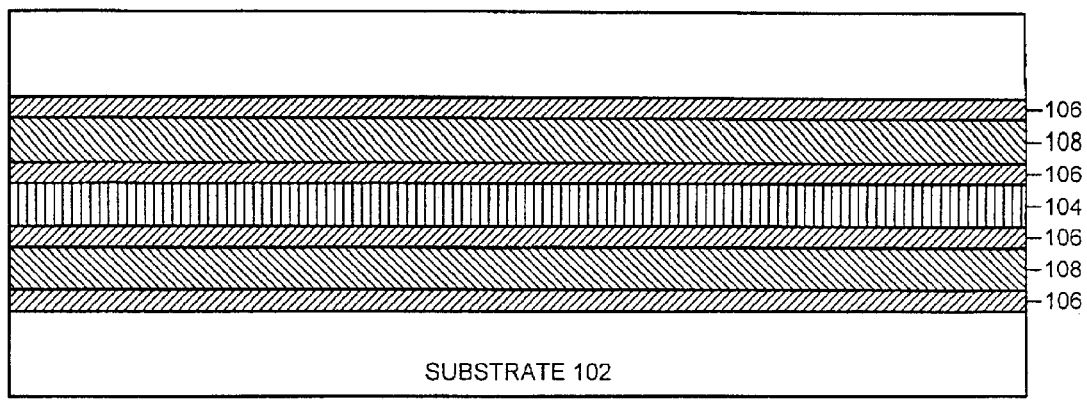
FIG. 1 illustrates an on-chip optical fiber in accordance with an embodiment of the present invention.

FIG. 1 illustrates an on-chip optical fiber in accordance with an embodiment of the present invention. In this cross-section view, optical fiber 104 is shown constructed on substrate 102. Optical fiber 104 is sheathed with cladding layer 106 and is enclosed with filler 108. Filler 108 can be a material such as the same material used for cladding layer 106 or the filler can include air or nitrogen. Note that this description related to optical fibers applies equally to structures other than optical fibers. A practitioner with ordinary skill in the art will be able to readily extend the techniques to other structures.

This optical fiber assembly can be constructed using chemical endpoint detection for etching as described in a U.S. Patent Application by Jeffrey J. Peterson and Charles E. Hunt entitled "Fabrication of Optical Components Using Si, SiGe, SiGeC, and Chemical Endpoint Detection," having Ser. No. 10/146,278, and filing date 15 May 2002 (Attorney Docket No. UC02-059-1), which is hereby incorporated by reference.

Chemical endpoint detection is described in detail in a U.S. Patent Application by Jeffrey J. Peterson and Charles E. Hunt entitled "Method and Apparatus for Fabricating Structures Using Chemically-Selective Endpoint Detection," having Ser. No. 09/900,300, and filing date Jul. 5, 2001 now U.S. Pat. No. 6,642,154, which is hereby incorporated by reference.

Etching the Optical Fiber

Figure 2:
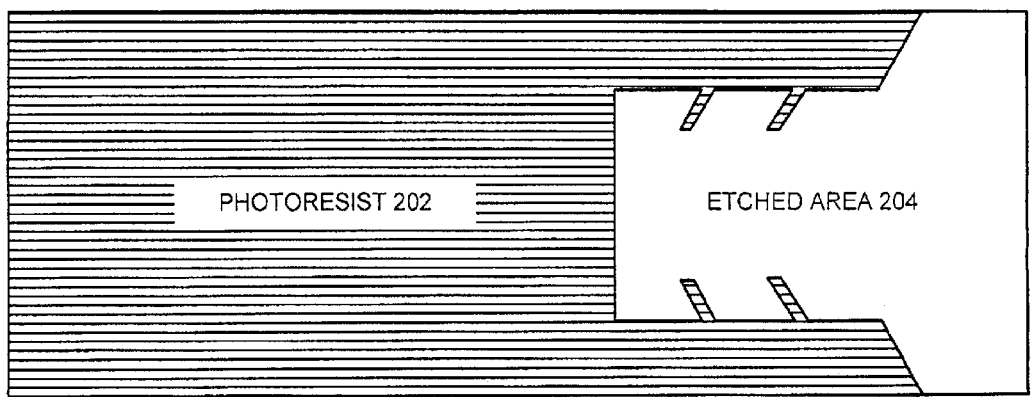
FIG. 2 illustrates masking and etching a photolithographically aligned connector to the on-chip optical fiber in accordance with an embodiment of the present invention.

FIG. 2 illustrates masking and etching a photo lithographically aligned connector to the on-chip optical fiber in accordance with an embodiment of the present invention. Photoresist 202 is applied to the on-chip optical fiber to pattern the fiber for etching. Other techniques for patterning the on-chip optical fiber can be used in place of photoresist 202. After application of photoresist 202, the on-chip optical fiber is etched to provide etched area 204. Etched area 204 provides access to substrate 102 for constructing interconnection structures. Note that etched area 204 provides access to the end of optical fiber 104.

Applying a Sacrificial Layer

Figure 3:
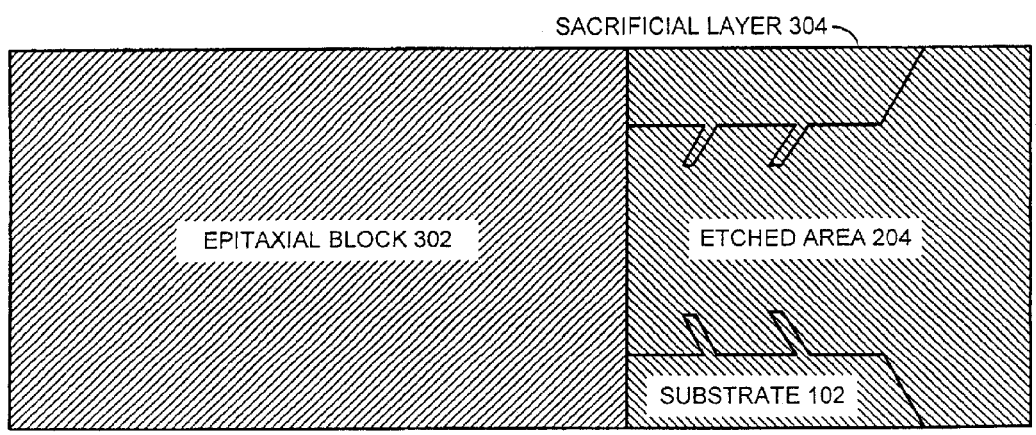
FIG. 3 illustrates a sacrificial layer deposited in the etched area of the on-chip optical fiber in accordance with an embodiment of the present invention.

FIG. 3 illustrates a sacrificial layer deposited in the etched area of the on-chip optical fiber in accordance with an embodiment of the present invention. After removing photoresist 202 or other patterning layers applied prior to etching, epitaxial block 302 is applied over portions of the structure to designate areas where sacrificial layer 304 is not desired. Sacrificial layer 304 is then grown epitaxially on the exposed areas. Sacrificial layer 304 allows subsequent epitaxial layers to be applied while maintaining the crystalline structure of the substrate.

After application of sacrificial layer 304, the surface can be planarized using chemo-mechanical polishing. This process is described in detail in a U.S. patent application by Jeffrey J. Peterson and Charles E. Hunt entitled "Fabricating Structures Using Chemo-Mechanical Polishing and Chemically-Selective Endpoint Detection," having Ser. No. 09/900,299, and filing date Jul. 5, 2001, which is hereby incorporated by reference.

Interconnection Structure

Figure 4:
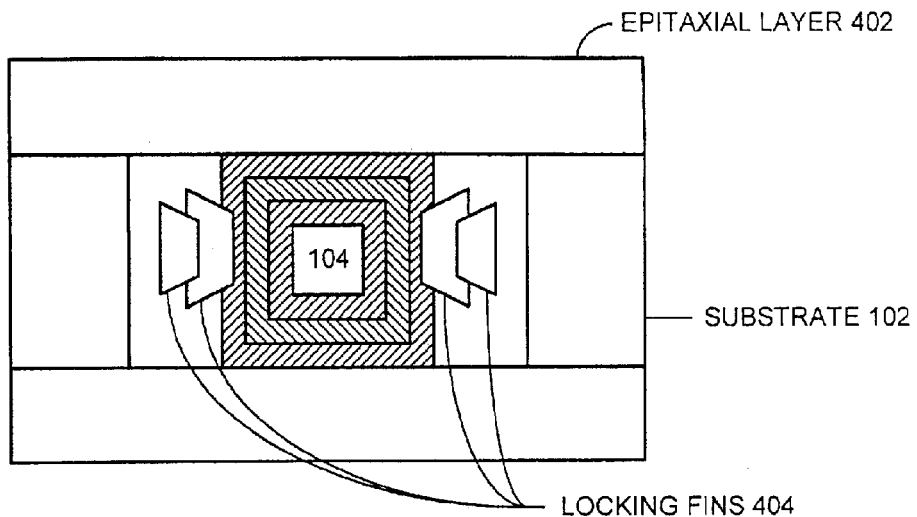
FIG. 4 illustrates an end view of the interconnection structure of the on-chip optical fiber in accordance with an embodiment of the present invention.

FIG. 4 illustrates an end view of the interconnection structure of the on-chip optical fiber in accordance with an embodiment of the present invention. After sacrificial layer 304 has been deposited and epitaxial block 302 has been removed, epitaxial layer 402 can be deposited on sacrificial layer 304. Epitaxial layer can contain components and structures as described in a U.S. patent application by Jeffrey J. Peterson and Charles E. Hunt entitled "Method of Fabricating Three-Dimensional Components Using Endpoint Detection," having Ser. No. 10/061,501, and filing date Jan. 31, 2002, which is hereby incorporated by reference.

After epitaxial layer 402 has been deposited, sacrificial layer 304 is removed by selective chemical etching. Removal of sacrificial layer 304 exposes optical fiber 104 and locking fins 404. The cavity formed by the removal of sacrificial layer 304 creates an interconnection structure, which can accept an optical fiber, or other structures. Alignment of the optical components is achieved by controlling the tolerance of the interconnection structure. Additionally, the interconnection structure can be designed such that the component being aligned with optical fiber 104 does not come in contact with optical fiber 104. Note that while this description discusses aligning optical components, other structures such as fluid piping can be aligned in the same manner.

Locks and Gaskets

Figure 5:
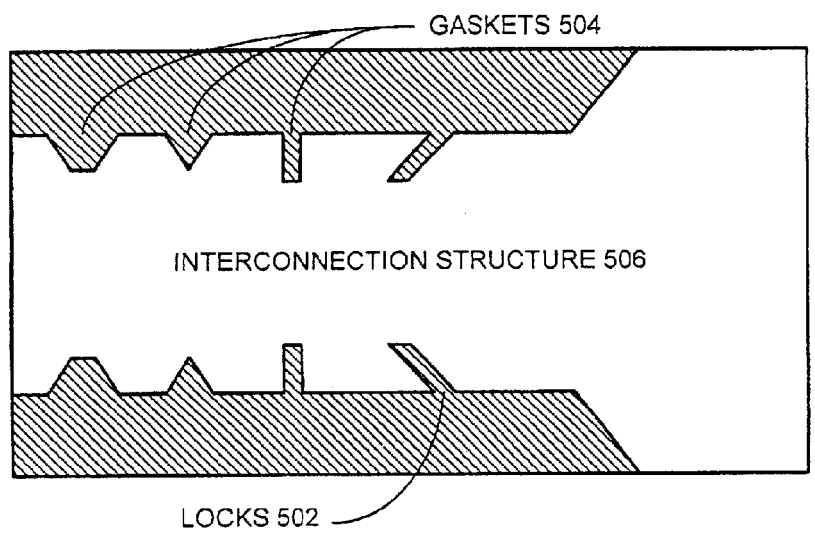
FIG. 5 illustrates locks and gaskets for the interconnection structure in accordance with an embodiment of the present invention.

FIG. 5 illustrates locks and gaskets for the interconnection structure in accordance with an embodiment of the present invention. Locks 502 protrude into interconnection structure 506 and, when engaged in notches in a corresponding interconnection structure, lock the corresponding interconnection structure into interconnection structure 506. Locks 502 can encircle interconnection structure 506 or can be locking fins such as locking fins 404 in FIG. 4. Gaskets 504 illustrate possible configurations of gaskets for sealing interconnection structure 506 to the corresponding interconnection structure. Since gaskets 504 are used to seal the interconnection structures, gaskets 504 completely encircle interconnection structure 506. Locks and gaskets of other configurations are equally likely.

Mechanical Alignment

Figure 6:
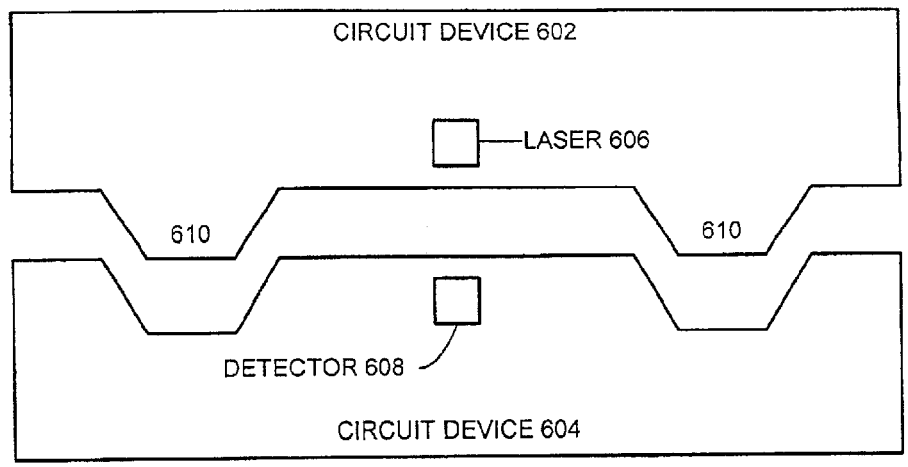
FIG. 6 illustrates mechanical alignment of two circuit devices in accordance with an embodiment of the present invention.

FIG. 6 illustrates mechanical alignment of two circuit devices in accordance with an embodiment of the present invention. Circuit devices 602 and 604 include interconnection structures 610. Interconnection structures 610 provide accurate alignment means for circuit devices 602 and 604. Circuit device 602 includes laser 606 while circuit device 604 includes detector 608. Interconnection structures 610 maintain alignment between laser 606 and detector 608. Other components are equally likely.

Fiberoptic Multiplexer

Figure 7:
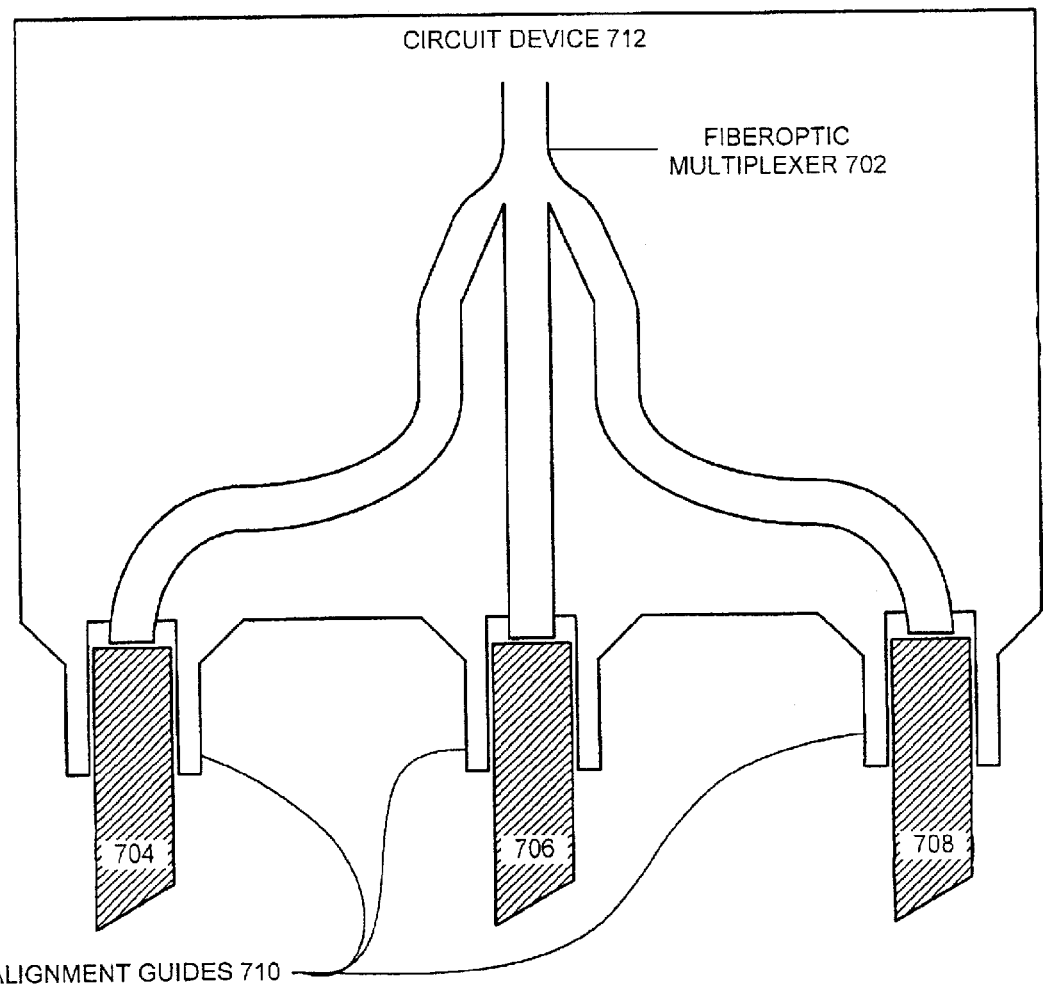
FIG. 7 illustrates a fiberoptic multiplexer in accordance with an embodiment of the present invention.

FIG. 7 illustrates a fiberoptic multiplexer in accordance with an embodiment of the present invention. Circuit device 712 includes fiberoptic multiplexer 702. Alignment guides 710 on circuit device 712 provide accurate alignment of optical fibers 704, 706, and 708. Optical fibers 704, 706, and 708 can be individual fibers or can be optical fibers on a circuit device as described above.

Fluid Interconnection

Figure 8:
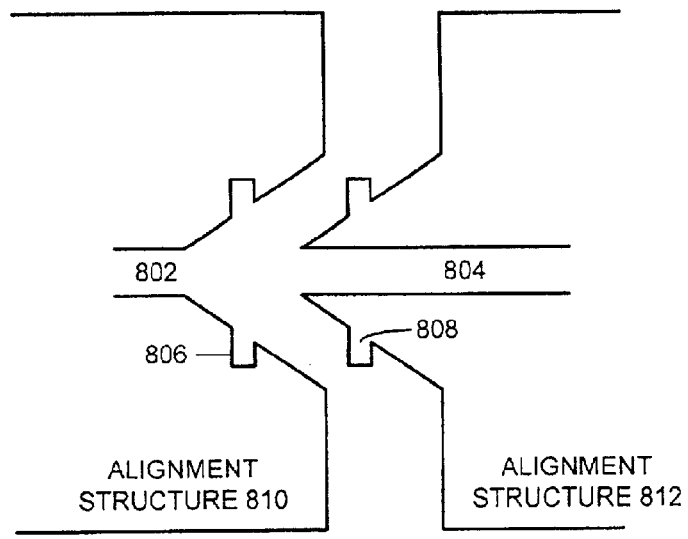
FIG. 8 illustrates a fluid interconnection in accordance with an embodiment of the present invention.

FIG. 8 illustrates a fluid interconnection in accordance with an embodiment of the present invention. Alignment structures 810 and 812 provide alignment for fluid pipes 802 and 804. Fluid pipes 802 and 804 can be used to couple liquids, gases, etc., from one circuit device to another circuit device. Gasket structures 806 and 808 provide locking and sealing between alignment structures 810 and 812.

The interconnection structures described above are just a few of the interconnection structures that can be created using this process. A practitioner with ordinary skill in the art will be able to devise many other interconnection structures.

Creating Interconnecting Structures

Figure 9:
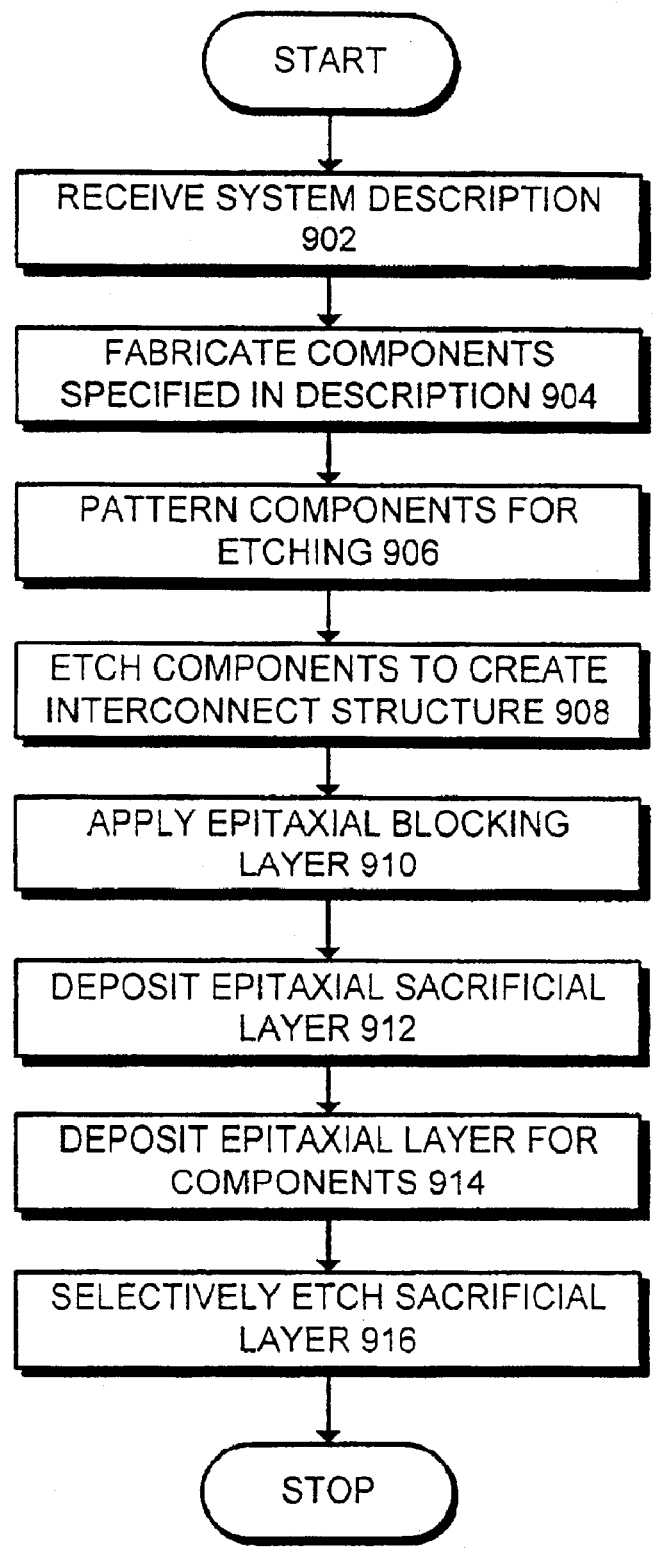
FIG. 9 is a flowchart illustrating the process of creating interconnecting structures in accordance with an embodiment of the present invention.

FIG. 9 is a flowchart illustrating the process of creating interconnecting structures in accordance with an embodiment of the present invention. The system starts when a system description including multiple components is received (step 902). Next, the system fabricates the components specified in the description (step 904). Note that these components can be multiple structures.

After the components have been fabricated, the system patterns the components for etching (step 906). This patterning can include photoresist or other forms of patterning. Next, the system etches the components to create an interconnection structure (step 908). The system then applies an epitaxial block on selected portions of the component (step 910).

After applying the epitaxial block, the system deposits an epitaxial sacrificial layer in the etched area where the interconnection structure is being formed and removes the epitaxial block (step 912). Next, the system deposits an epitaxial component layer on the sacrificial layer so that components can be formed, possibly in three dimensions (step 914). Note that this layer maintains the same crystalline structure as the substrate. Finally, the sacrificial layer is removed using selective etching, thereby creating the interconnection structure (step 916).

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method to facilitate construction of electromagnetic, optical, chemical, and/or mechanical systems using chemical endpoint detection, comprising:

receiving a system description, wherein the system description specifies a plurality of components, including a first component and a second component;

fabricating the first component and the second component using a selected construction material, wherein fabrication the first component and the second component involves using chemical endpoint detection;

fabricating, gaskets on at least one of the first interconnection structure and the second interconnection structure by forming the gaskets in the selected construction material, whereby an interface between the first component and the second component is sealed to prevent leakage when the first interconnection structure is inserted into the second interconnection structure; and bringing the first component and the second component together by inserting a first interconnection structure into a second interconnection structure;

whereby the first component is aligned to the second component.

2. The method of claim 1, further comprising creating the first interconnection structure on the first component and the second interconnection structure on the second component using a sacrificial layer and chemical endpoint detection.

3. The method of claim 1, wherein the selected construction material includes Si.

4. The method of claim 3, wherein chemical endpoint detection involves selectively etching the selected construction material.

5. The method of claim 4, wherein tetraethylammonium hydroxide (TMAH) or potassium hydroxide ($KOH-H_2O$) is used to selectively etch Si.

6. The method of claim 1, wherein the first component includes an optical component.

7. The method of claim 1, wherein the second component includes an optical component.

8. The method of claim 1, further comprising fabricating locking structures on the first interconnection structure and the second interconnection structure, whereby the first component and the second component are locked together when the first interconnection structure is inserted into the second interconnection structure.

9. The method of claim 1, further comprising creating a third interconnection structure, wherein the third interconnection structure can accept an individual optical fiber.

10. The method of claim 1, wherein the first component is constructed on a first substrate and the second component is constructed on a second substrate.

11. A method to facilitate construction of a system using an interconnection structure, comprising:

receiving a description of the system, wherein the description specifies a plurality of components, including a first component and a second component;

fabricating the first component and the second component using a selected construction material, wherein fabrication the first component and the second component involves using chemical endpoint detection;

fabricating gaskets on at least one of the first interconnection structure and the second interconnection structure by forming the gaskets in the selected construction material, whereby an interface between the first component and the second component is sealed to prevent leakage when the first interconnection structure is inserted into the second interconnection structure; and bringing the first component and the second component together by inserting a first interconnection structure into a second interconnection structure;

whereby the first component is aligned to the second component.

12. The method of claim 11, further comprising creating the first interconnection structure on the first component and the second interconnection structure on the second component using a sacrificial layer and chemical endpoint detection.

13. The method of claim 11, wherein the selected construction material includes Si.

14. The method of claim 13, wherein chemical endpoint detection involves selectively etching the selected construction material.

15. The method of claim 14, wherein tetramethylammonium hydroxide (TMAH) or potassium hydroxide (KOH-$H_2O$) is used to selectively etch Si.

16. The method of claim 11, wherein the first component includes an optical component.

17. The method of claim 11, wherein the second component includes an optical component.

18. The method of claim 11, further comprising fabricating gaskets on the first interconnection structure and the second interconnection structure, whereby an interface between the first component and the second component is sealed to prevent fluid leakage when the first interconnection structure is inserted into the second interconnection structure.

19. The method of claim 11, further comprising creating a third interconnection structure, wherein the third interconnection structure can accept an individual optical fiber.

20. The method of claim 11, wherein the first component is constructed on a first substrate and the second component is constructed on a second substrate.

* * * * *